(12) United States Patent
Heller

(10) Patent No.: US 12,313,662 B2
(45) Date of Patent: May 27, 2025

(54) CHECKING APPARATUS FOR CHECKING A NUMBER OF START CYCLES OF A DETECTION DEVICE OF A MOTOR VEHICLE, AND METHOD

(71) Applicant: Bayerische Motoren Werke Aktiengesellschaft, Munich (DE)

(72) Inventor: Martin Heller, Graben (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 398 days.

(21) Appl. No.: 17/784,174

(22) PCT Filed: Nov. 24, 2020

(86) PCT No.: PCT/EP2020/083188
§ 371 (c)(1),
(2) Date: Jun. 10, 2022

(87) PCT Pub. No.: WO2021/115777
PCT Pub. Date: Jun. 17, 2021

(65) Prior Publication Data
US 2023/0023763 A1 Jan. 26, 2023

(30) Foreign Application Priority Data
Dec. 11, 2019 (DE) ...................... 10 2019 133 918.9

(51) Int. Cl.
| | |
|---|---|
| *G01R 19/165* | (2006.01) |
| *G01R 19/145* | (2006.01) |
| *G01R 19/17* | (2006.01) |
| *G01R 29/20* | (2006.01) |
| *G01R 31/327* | (2006.01) |

(52) U.S. Cl.
CPC ....... *G01R 19/1659* (2013.01); *G01R 19/145* (2013.01); *G01R 19/17* (2013.01); *G01R 29/20* (2013.01); *G01R 31/327* (2013.01)

(58) Field of Classification Search
CPC .. G01R 19/1659; G01R 19/145; G01R 19/17; G01R 29/20; G01R 31/327;
(Continued)

(56) References Cited

U.S. PATENT DOCUMENTS

| | | |
|---|---|---|
| 5,771,474 A | 6/1998 | Matt et al. |
| 6,012,005 A | 1/2000 | Gscheidle et al. |
| | (Continued) | |

FOREIGN PATENT DOCUMENTS

| | | |
|---|---|---|
| CN | 102472633 A | 5/2012 |
| CN | 103958942 A | 7/2014 |
| | (Continued) | |

OTHER PUBLICATIONS

Infineon TLE4943C Data Sheet (Jul. 2018) (Year: 2018).*
(Continued)

*Primary Examiner* — Lisa M Caputo
*Assistant Examiner* — Cynthia L Davis
(74) *Attorney, Agent, or Firm* — Crowell & Moring LLP

(57) ABSTRACT

A checking apparatus for checking a number of start-up cycles of a detection device of a motor vehicle includes an electrical switching device for providing an electrical sensor supply for the detection device and includes a contact device for electrically contacting the electrical switching device with the detection device. The electrical switching device has a comparator circuit and, by way of the comparator circuit, a continuous wake up test of the detection device is carried out and thus the number of start cycles is checked.

10 Claims, 2 Drawing Sheets

(58) Field of Classification Search
CPC ...... G01D 2218/10; G01D 3/08; G01D 21/00; G01D 18/00; G01P 21/02
See application file for complete search history.

(56) References Cited

U.S. PATENT DOCUMENTS

| | | | |
|---|---|---|---|
| 6,249,720 B1* | 6/2001 | Kubota | G01C 21/3629 |
| | | | 701/1 |
| 8,744,773 B2 | 6/2014 | Woytowitz et al. | |
| 2005/0262921 A1* | 12/2005 | Arntz | G01D 3/08 |
| | | | 73/1.37 |
| 2011/0288775 A1 | 11/2011 | Woytowitz et al. | |
| 2012/0326706 A1 | 12/2012 | Vetter | |
| 2014/0288807 A1 | 9/2014 | Tribulowski et al. | |
| 2018/0290642 A1 | 10/2018 | Tschiene | |

FOREIGN PATENT DOCUMENTS

| | | | | |
|---|---|---|---|---|
| CN | 105067998 A | | 11/2015 | |
| CN | 105940390 A | * | 9/2016 | ............. G01D 21/00 |
| DE | 44 00 079 A1 | | 7/1995 | |
| DE | 196 35 440 A1 | | 3/1998 | |
| DE | 10 2017 209 721 A1 | | 10/2018 | |

OTHER PUBLICATIONS

Chinese-language Office Action issued in Chinese Application No. 202080080675.5 dated Feb. 26, 2024 with English translation (14 pages).

International Search Report (PCT/ISA/210) issued in PCT Application No. PCT/EP2020/083188 dated Feb. 5, 2021 with English translation (four (4) pages).

German-language Written Opinion (PCT/ISA/237) issued in PCT Application No. PCT/EP2020/083188 dated Feb. 5, 2021 (seven (7) pages).

German-language Search Report issued in German Application No. 10 2019 133 918.9 dated Oct. 13, 2020 with partial English translation (10 pages).

Chinese-language Office Action issued in Chinese Apptication No. 202080080675.5 dated Aug. 28, 2024 with English translation (11 pages).

* cited by examiner

CHECKING APPARATUS FOR CHECKING A NUMBER OF START CYCLES OF A DETECTION DEVICE OF A MOTOR VEHICLE, AND METHOD

BACKGROUND AND SUMMARY

The invention relates to a checking method and apparatus for checking a number of start-up cycles of a detection device of a motor vehicle.

According to the prior art, vehicle components, for example detection devices for at least partially autonomously operated motor vehicles, are designed for a predefined service life, or operating years. A predefined number of start-up cycles is predefined based on this lifetime, for example. This number of start-up cycles is worked out in particular on the basis of requirements of test schedules, which not only establish the required loadings but also ensure that the components under test are not overloaded. In particular, in the at least partially autonomous driving mode of a motor vehicle, in particular in the fully autonomous mode of a motor vehicle, the components of the corresponding driving systems for example perform self-tests that intentionally bring about a reset and a restart in order to detect "dormant" faults and, for example, to ensure redundancy within a corresponding assistance system. These restarts may for example double, in particular significantly multiply, the number of start-ups performed. It is therefore no longer sufficient to make corresponding specifications for start-up cycles in accordance with the prior art.

The prior art likewise discloses a method for inspecting a sensor measuring a movement, in particular a level sensor of a motor vehicle. The sensor is positioned in a test bench by an electric stepper motor whose axis of rotation is initially positioned in a neutral position with the axis of rotation of the sensor, wherein the respective sensor signal is then ascertained in a plurality of angle of rotation segments set by the stepper motor. A lever arm may be provided on the sensor, and the lever arm may be rotated by the electric stepper motor by way of a driver. A preferred test bench for performing the method consists of a carrier plate receiving the sensor and a portal extending over the latter, which carries the electric stepper motor and on which a driver driven by the stepper motor is rotatably mounted and engages in the lever arm of the sensor.

The object of the present invention is to provide a checking apparatus and a method by way of which a number of start-up cycles of a detection device of a motor vehicle is able to be checked in an improved manner.

This object is achieved by a checking apparatus and by a method according to the independent patent claims. Advantageous embodiments are specified in the dependent claims.

One aspect of the invention relates to a checking apparatus for checking a number of start-up cycles of a detection device of a motor vehicle, having an electrical switching device for providing an electric sensor power supply for the detection device and having a contact device for creating electrical contact between the electrical switching device and the detection device.

Provision is made for the electrical switching device to have a comparator circuit and for a continuous wake-up test on the detection device to be performed by way of the comparator circuit and thus for the number of start-up cycles to be checked.

This makes it possible for the number of start-up cycles to be able to be checked within a continuous wake-up test. This thus makes it possible to be able to check the number of start-up cycles of the detection device within a very short time, in particular since the detection device does not have to be arranged on the motor vehicle.

It is thus in particular possible to perform supervised and monitored deactivation of the detection device, which is in particular temporally monitored, is supervised and a following start-up is likewise able to be detected. As a result of repeating the cyclic reset processes and recording the start-up that has taken place or has not taken place or is temporally correct or incorrect, it is possible to establish the suitability of the detection device in a corresponding assistance system of the motor vehicle, independently of a supplier.

In other words, the invention is based on the possibility of easily actuating and simultaneously evaluating the transmission function of a detection device by way of the comparator circuit. It is thus in particular possible to perform process-controlled actuation, for example using an Arduino, in order to perform the continuous wake-up test on the detection device.

Provision may preferably be made for a wheel speed sensor to be checked as the detection device. This list is however purely exemplary and should in no way be considered to be definitive. Other detection devices of the motor vehicle may also be checked. The detection device may in particular also be referred to as a sensor below.

According to one advantageous embodiment, the comparator circuit has at least one first comparator that is designed to detect a current pulse of greater than three milliamperes (3 mA). In particular, as a result of the activation of the power supply to the detection device following an initialization phase, the detection device may cyclically transmit a current pulse of in particular three milliamperes on the bus in accordance with a specification. These then signal activity of the sensor or else a correct start-up, independently of the function. The start-up of the sensor, in particular of the detection device, should be performed in this case in accordance with the specification, including depending on an identified target. The initialization or a reset in the case of a moving target works more quickly than in the case of a stationary motor vehicle or in the case of a stationary target. The first comparator thus makes it possible to be able to reliably check the number of start-up cycles of the detection device.

It is furthermore advantageous for the comparator circuit to have a second comparator that is designed to detect a current pulse of greater than 14 milliamperes (14 mA). In particular, as a result of the activation of the power supply to the detection device following an initialization phase of the detection device, a current pulse of 14 milliamperes may be transmitted cyclically on the bus in accordance with a specification. These signal activity of the detection device or else a correct start-up, independently of the function. The start-up of the detection device is in this case necessary in accordance with the specification, including depending on an identified target. The initialization or the reset during a moving target works more quickly than in the case of a stationary vehicle or in the case of a stationary target.

In a further advantageous embodiment, the comparator circuit has at least one electronic computing device by way of which the continuous wake-up test is performed. By way of example, the electronic computing device may have two interrupt inputs in order to read in current value changes. The electronic computing device may furthermore have a digital input for monitoring a relay. The electronic computing device may furthermore have a digital output in order to actuate a relay. The electronic computing device may furthermore have an analog input in order to monitor a reference voltage.

It is likewise advantageous for the electronic computing device to be designed to read in an interrupt request, which may also be referred to as interrupt, and/or to actuate a switching element of the comparator circuit and/or to monitor a digital input of the electronic computing device for actuating the switching element. The electronic computing device is thus in particular designed to read in an interrupt, to actuate the relay, which is the switching element, and to monitor a digital input that ensures the switching function of the relay. The check on the number of start-up cycles may in this case be performed easily.

It is likewise advantageous for the electronic computing device to have a real-time clock for generating a timestamp during a checking process. It is in particular made possible, based on the real time, to be able to precisely monitor the timing of the resets and the start-up. The check on the number of start-up cycles is thereby able to be performed reliably.

In a further advantageous embodiment, the comparator circuit has at least one switching element for establishing or interrupting the voltage supply. The switching element may in particular be provided in the form of a relay. The relay in particular has a sufficient number of switching cycles and fast switching hysteresis. The switching element may in particular be actuated by way of the electronic computing device. This makes it possible for the detection device or the electric power supply to the detection device to be able to be activated and deactivated.

A further aspect of the invention relates to a method for operating a checking apparatus for checking a number of start-up cycles of a detection device of a motor vehicle, in which an electric sensor power supply for the detection device is provided by way of an electrical switching device and in which the electrical switching device is put in contact with the detection device by way of a contact device.

Provision is made for the electrical switching device to have a comparator circuit and for a continuous wake-up test on the detection device to be performed by way of the comparator circuit and thus for the number of start-up cycles to be checked.

In particular, in the method according to the invention, a test counter is reset and a timestamp is set and documented. All input channels are furthermore inspected for an open relay with a zero level of the interrupt inputs and an analog voltage frequency. The power supply relay is furthermore switched and the timestamp is set. Following this, the input channels are checked for a change in setpoint value of the sensor current. There is then a wait for a defined delay. The reset is then actuated by the power supply relay and the timestamp is set. The interrupts are monitored and the timestamps are set in the event of a value change. There is also a wait for a defined debouncing time. Following this, the power supply relay is actuated and a timestamp is set. Following this, the interrupt is monitored and the timestamps are set in the event of the value change. The delta times are then calculated from the timestamp and there is a comparison with setpoint and debouncing times in accordance with the sensor specification. The reset counter is incremented by one. The switching states of the relay and the reference voltage are continuously monitored. The sequences are repeated until a desired number of cycles is reached. Provision is in particular made for a fault routine to be conjointly implemented in a corresponding computer program for the method according to the invention.

In one advantageous embodiment of the method, a timestamp of a start-up of the detection device and a timestamp of a reset of the detection device are documented and evaluated by way of an electronic computing device of the checking apparatus.

Provision may likewise be made, in the method, for a further restart that has taken place with the restart also to be documented by way of the electronic computing device and taken into consideration in the evaluation.

Advantageous embodiments of the checking apparatus are to be considered as advantageous refinements of the method. Advantageous embodiments of the method are furthermore to be considered as advantageous embodiments of the checking apparatus. The checking apparatus to this end has substantive features that make it possible to perform the method and an advantageous embodiment thereof.

Further features of the invention will become apparent from the claims, the figures and the description of the figures. The features and combinations of features mentioned above in the description and the features and combinations of features mentioned below in the description of the figures and/or shown on their own in the figures may be used not only in the respectively specified combination but also in other combinations or on their own.

The invention is now explained in more detail with reference to one preferred exemplary embodiment and with reference to the drawings.

BRIEF DESCRIPTION OF THE DRAWINGS

Identical or functionally identical elements are provided with the same reference signs in the figures.

BRIEF DESCRIPTION OF THE DRAWINGS

Figure 1:
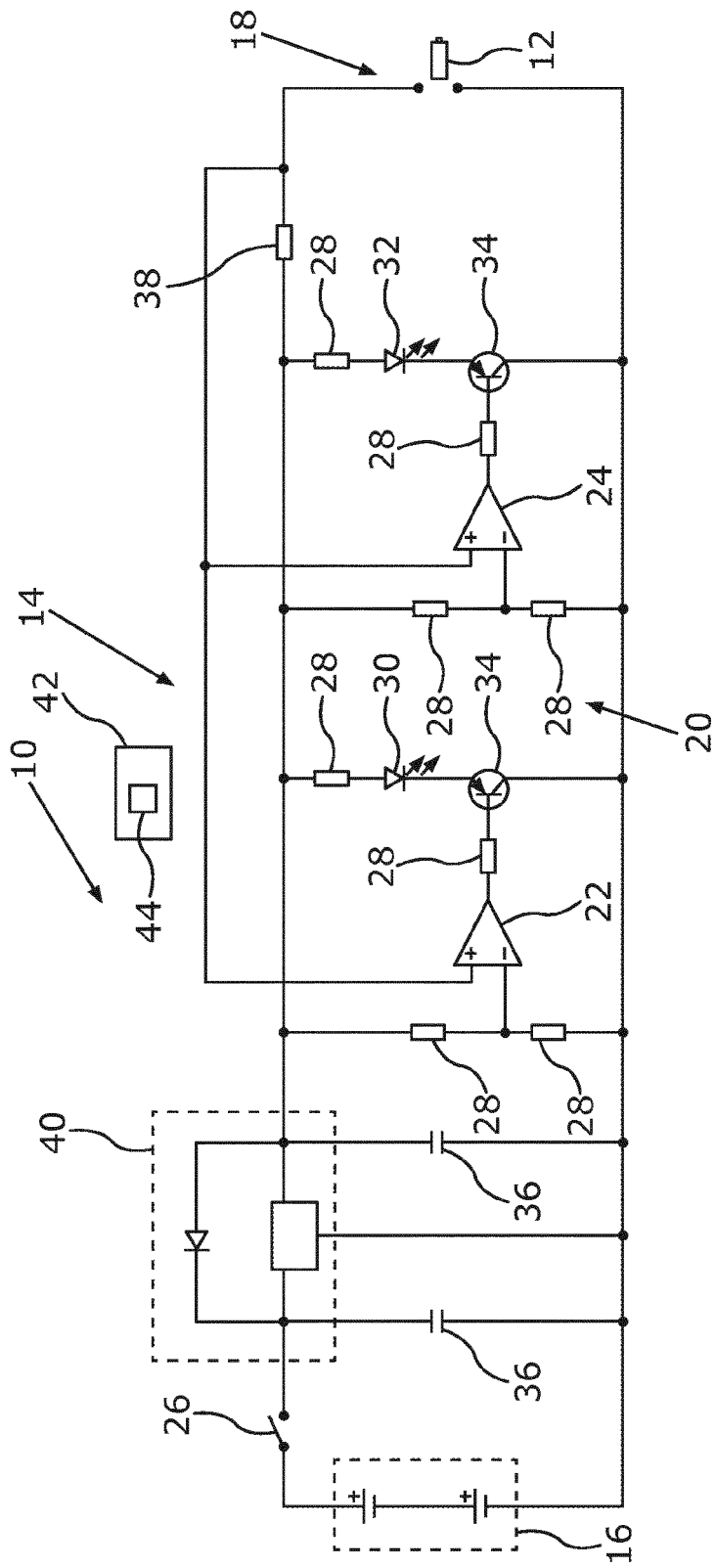
FIG. 1 is a schematic block diagram of one embodiment of a checking apparatus.

FIG. 1 shows a schematic view of a block diagram of one embodiment of a checking apparatus 10. The checking apparatus 10 is designed to check a number of start-up cycles of a detection device 12 of a motor vehicle, not illustrated. The checking apparatus 10 has an electrical switching device 14 that is designed to provide an electric sensor power supply 16 for the detection device 12. The checking apparatus 10 furthermore has a contact device 18 for creating electrical contact between the electrical switching device 14 and the detection device 12.

Provision is made for the electrical switching device 14 to have a comparator circuit 20 and for a continuous wake-up test on the detection device 12 to be performed by way of the comparator circuit 20 and thus for the number of start-up cycles to be checked.

FIG. 1 shows in particular that the comparator circuit 20 has a first comparator 22 that is designed to detect a current pulse of greater than three milliamperes (3 mA). FIG. 1 furthermore shows that the comparator circuit 20 has a second comparator 24 that is designed to detect a current pulse of greater than 14 milliamperes (14 mA).

FIG. 1 furthermore shows in particular that the comparator circuit 20 has at least one switching element 26 for establishing or interrupting the voltage supply 16. The comparator circuit 20 furthermore has a multiplicity of electrical resistors 28 that are designed in particular as ohmic resistors. FIG. 1 furthermore shows that the comparator circuit 20 may have a first light-emitting diode 30 and a second light-emitting diode 32. The comparator circuit 20 furthermore has two MOSFETs 34. The comparator circuit 20 likewise has two capacitors 36. The comparator circuit 20 furthermore has a shunt resistor 38. Provision is likewise made for the comparator circuit 20 to have a voltage controller 40.

FIG. 1 furthermore shows that the comparator circuit 20 has at least one electronic computing device 42 by way of which the continuous wake-up test is performed. The electronic computing device 42 may in particular be designed to read in an interrupt request and/or to actuate the switching element 26 of the comparator circuit 20 and/or to monitor a digital input of the electronic computing device 42 for actuating the switching element 26.

Provision may furthermore be made for the electronic computing device 42 to have a real-time clock 44 that is designed to generate a timestamp during a checking process.

In FIG. 1, the detection device 12 is designed for example as a wheel speed sensor of the motor vehicle. The wheel speed sensor basically functions as a power interface. As a result of the activation of the power supply to the detection device 12, following an initialization phase of the detection device 12, a current pulse of approximately three milliamperes or 14 milliamperes is transmitted cyclically on a corresponding bus in accordance with its specification. These current pulses signal an activity of the detection device 12 or else a correct start-up, independently of the function. The start-up of the detection device 12 is in this case also dependent on an identified target, in accordance with the specification. The initialization or a reset during the moving target works more quickly than in the case of a stationary motor vehicle or a resting target.

According to the invention, it is thus now made possible, through supervised and monitored deactivation of the sensor power supply, to trigger a reset, to temporally monitor it, to supervise it, and likewise to detect the following start-up. By repeating the cyclic reset processes and recording the start-up that has taken place or has not taken place or is temporally correct or incorrect, it is possible to establish the suitability of the detection devices 12 in, for example, an assistance system of the motor vehicle, independently of a supplier.

The comparator circuit 20 in particular for this purpose has a reference voltage supply for the detection device 12. Provision is furthermore made for the first comparator 22 and the second comparator 24. Provision is furthermore made for the electronic computing device 42, which may also be referred to as controller, wherein the electronic computing device 42 for example has two interrupt inputs in order to read in a current value change. The electronic computing device 42 furthermore has a digital input in order to monitor a relay, in particular the switching element 26. The electronic computing device 42 furthermore has a digital output in order to actuate the relay. The electronic computing device 42 furthermore has an analog input in order to monitor a reference voltage. The electronic computing device 42 in particular has the real-time clock 44 in order to be able to precisely assign a timestamp. The switching element 26 is in particular designed with sufficient switching cycles and fast switching hysteresis. The voltage supply is in particular provided by the electronic computing device 42. Provision is furthermore in particular made for a computer program product that is executed on the electronic computing device 42 and that in particular reads in the interrupt requests, which are referred to as interrupts, actuates the relay and monitors a digital input that ensures the switching function of the relay.

Figure 2:
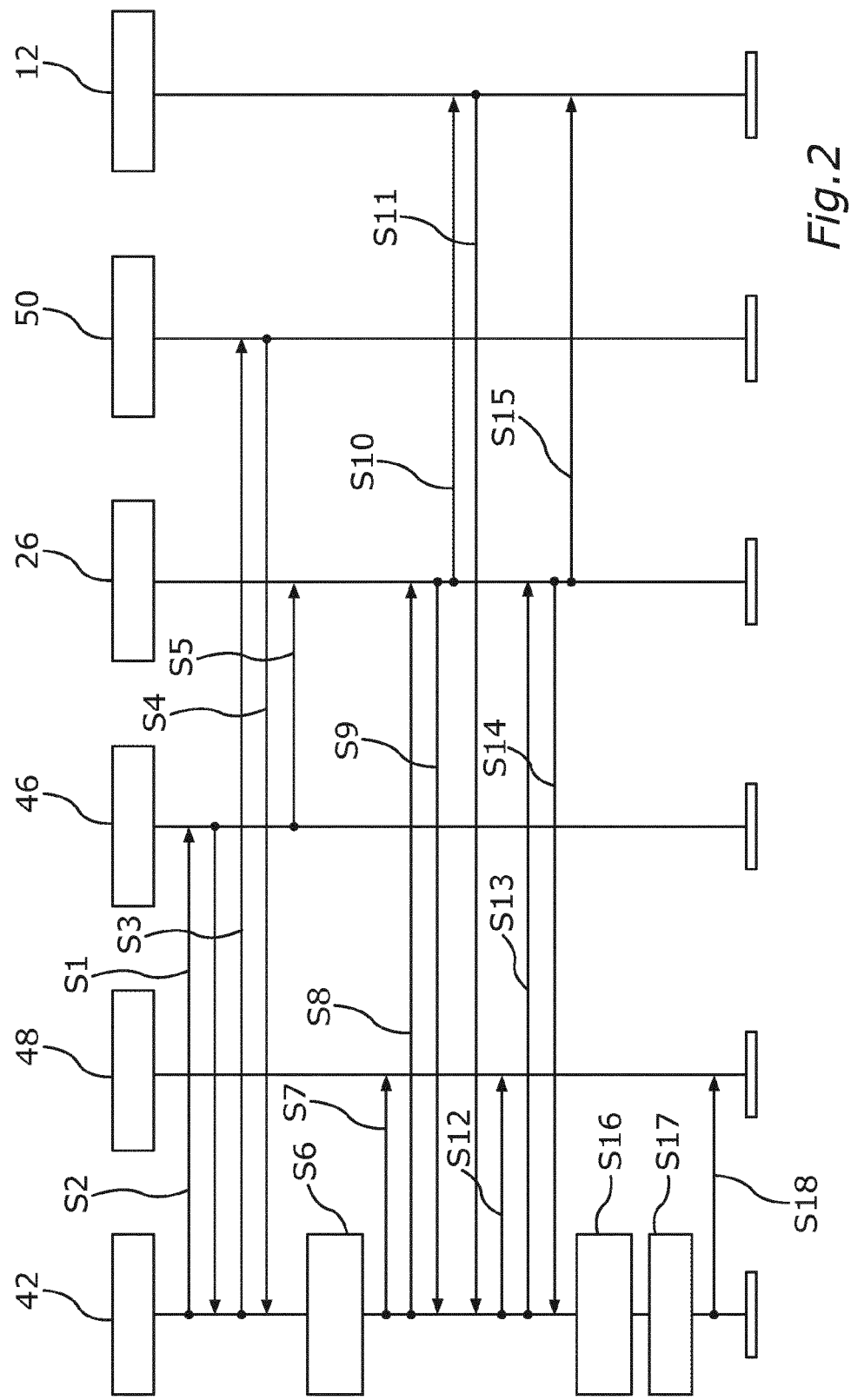
FIG. 2 is a schematic view of a flowchart of a method.

FIG. 2 shows a schematic view of one embodiment of a method according to the invention. In particular, in the method for operating the checking apparatus 10 for checking the number of start-up cycles of the detection device 12 of the motor vehicle, the electric sensor power supply 16 for the detection device 12 is provided by way of the electrical switching device 14 and the electrical switching device 14 is put in contact with the detection device 12 by way of the contact device 18. Provision is made in this case for the electrical switching device 14 to have the comparator circuit 20 and for the continuous wake-up test on the detection device 12 to be performed by way of the comparator circuit 20 and thus for the number of start-up cycles to be checked.

FIG. 2 in particular shows that a timestamp of a start-up of the detection device 12 and a timestamp of a reset of the detection device 12 are documented and evaluated by way of the electronic computing device 42 of the checking apparatus 10. A further start-up that has taken place following the start-up may in particular be documented by way of the electronic computing device 42 and taken into consideration in the evaluation.

In particular, according to FIG. 2, in a first step S1, there is a signal to a reference voltage 46 that the reference voltage 46 should be activated. In a second step S2, the feedback takes place as control operation. In a third step S3, there is an activation signal to a computer program 50. In a fourth step S4, there is feedback from the computer program 50 to the electronic computing device 42 that the checking process has started. In a fifth step S5, the sensor power supply 16 is provided by a reference voltage 46 by switching of the switching element 26. In a sixth step S6, the detected switching states and the reference voltages are assessed. In a seventh step S7, there is an actuation signal from the electronic computing device 42 to a signal unit 48. In an eighth step S8, the switching element 26 is activated by way of the electronic computing device 42. In a ninth step S9, a switching process inspection takes place and the timestamp is detected. In a tenth step S10, the sensor power supply 16 is activated and the detection device 12 is thus activated. In an eleventh step S11, a sensor inspection takes place and the timestamp is detected by the electronic computing device 42. In a twelfth step S12, actuation is performed by the electronic computing device 42 on the basis of the signal unit 48. In a $13^{th}$ step S13, the switching element 26 is deactivated. In a $14^{th}$ step S14, a switching process inspection and a timestamp detection take place. In a $15^{th}$ step S15, the detection device 12 is deactivated by the switching element 26. In a $16^{th}$ step S16, the detected timestamps and the switching times are calculated or determined, compared and assessed. In a $17^{th}$ step S17, the start-up counter is incremented and the sequence is repeated with the defined parameters. In an $18^{th}$ step S18, the signal unit 48 is actuated by the electronic computing device 42.

The following exemplary embodiment discusses in particular a wheel speed sensor as detection device 12. In other words, the solution according to the invention may be intended for example for a brake control system and provision should in this case be made for the start-up cycles to be able to be checked reliably and quickly. The present system is additionally configurable for any kind of detection device 12 or sensors or controllers.

On the whole, the invention discloses a start-up cycle test system for wheel speed sensors having power interfaces and analog sensors in general.

LIST OF REFERENCE SIGNS 10 checking apparatus
12 detection device 14 electrical switching device
16 electric sensor power supply
18 contact device
20 comparator circuit
22 first comparator
24 second comparator
26 switching element
28 ohmic resistor
30 first light-emitting diode
32 second light-emitting diode
34 MOSFET
36 capacitor
38 shunt resistor
40 voltage controller
42 electronic computing device
44 real-time clock
46 reference voltage
48 signal unit
50 computer program
S1 first step
S2 second step
S3 third step
S4 fourth step
S5 fifth step
S6 sixth step
S7 seventh step
S8 eighth step
S9 ninth step
S10 tenth step
S11 eleventh step
S12 twelfth step
S13 13$^{th}$ step
S14 14$^{th}$ step
S15 15$^{th}$ step
S16 16$^{th}$ step
S17 17$^{th}$ step
S18 18$^{th}$ step

What is claimed is:

1. A checking apparatus for checking a number of start-up cycles of a detection device of a motor vehicle, comprising:
an electrical switching device for providing an electric sensor power supply for the detection device; and
a contact device for creating electrical contact between the electrical switching device and the detection device,
wherein the electrical switching device has a comparator circuit that performs a continuous wake-up test on the detection device,
wherein the continuous wake-up test detects current pulses from the detection device that are indicative of a start-up cycle of the detection device independent of a sensing function and as a result of providing the electric sensor power supply, and
wherein the number of start-up cycles is checked via the detection of current pulses during the continuous wake-up test.

2. The checking apparatus according to claim 1, wherein the comparator circuit comprises at least one first comparator configured to detect a current pulse of greater than 3 mA.

3. The checking apparatus according to claim 2, wherein the comparator circuit comprises a second comparator configured to detect a current pulse of greater than 14 mA.

4. The checking apparatus according to claim 1, wherein the comparator circuit comprises at least one electronic computing device by way of which the continuous wake-up test is performed.

5. The checking apparatus according to claim 4, wherein the electronic computing device is configured to read in an interrupt request, to actuate a switching element of the comparator circuit, and/or to monitor a digital input of the electronic computing device for actuating the switching element.

6. The checking apparatus according to claim 5, wherein the electronic computing device has a real-time clock for generating a timestamp during a checking process.

7. The checking apparatus according to claim 1, wherein the comparator circuit comprises at least one switching element for establishing or interrupting the power supply.

8. A method for operating a checking apparatus for checking a number of start-up cycles of a detection device of a motor vehicle, in which an electric sensor power supply for the detection device is provided by way of an electrical switching device, the method comprising:
contacting, via a contact device, the electrical switching device with the detection device, the electrical switching device comprising a comparator circuit; and
performing a continuous wake-up test on the detection device, by way of the comparator circuit,
wherein the continuous wake-up test detects current pulses from the detection device that are indicative of a start-up cycle of the detection device independent of a sensing function and as a result of providing the electric sensor power supply, and
whereby a number of start-up cycles is checked via the detection of current pulses during the continuous wake-up test.

9. The method according to claim 8, further comprising:
documenting and evaluating, via an electronic computing device of the checking apparatus, a timestamp of a start-up of the detection device and a timestamp of a reset of the detection device.

10. The method according to claim 9, wherein a further start-up that has taken place following the start-up is documented by way of the electronic computing device and is taken into consideration in the evaluation.

* * * * *